United States Patent [19]
Bae et al.

[11] Patent Number: 5,675,418
[45] Date of Patent: Oct. 7, 1997

[54] PATTERN ALIGNMENT MARK OF SEMICONDUCTOR DEVICE

[75] Inventors: Sang Man Bae; Byoung Il Choi, both of Bubaleub, Rep. of Korea

[73] Assignee: Hyundai Electronics Industries Co., Ltd., Rep. of Korea

[21] Appl. No.: 499,272

[22] Filed: Jul. 7, 1995

[30] Foreign Application Priority Data

Jul. 7, 1994 [KR] Rep. of Korea ................ 1994-16362

[51] Int. Cl.⁶ ........................................ G01B 11/00
[52] U.S. Cl. ................................ 356/399; 356/400
[58] Field of Search ........................ 356/399–401, 356/363; 250/548, 557, 571

[56] References Cited

U.S. PATENT DOCUMENTS

4,769,551  9/1988  Hamashima ................ 250/548
4,880,309  11/1989  Wanta ........................ 356/401
5,170,293  12/1992  Tanimoto .................... 359/894
5,333,050  7/1994  Nose .......................... 356/356

*Primary Examiner*—Frank G. Font
*Assistant Examiner*—Michael P. Stafira
*Attorney, Agent, or Firm*—Merchant, Gould, Smith, Edell, Welter & Schmidt P.A.

[57] ABSTRACT

A pattern alignment mark equipped with at least one designated measuring pattern for an alignment during the process of fabrication of semiconductor devices, a means for attenuating light reflection on the pattern with higher light reflection intensity among said designated measuring patterns, said attenuating means preventing the occurrence of a pattern alignment error due to the differences in the light reflection intensities while measuring the overlay accuracy of patterns, thus enhancing the yield and reliability of fabrication by achieving the stabilization of the process and the reduction of the process time.

12 Claims, 8 Drawing Sheets

PATTERN ALIGNMENT MARK OF SEMICONDUCTOR DEVICE

BACKGROUND OF THE INVENTION

The present invention relates to a pattern alignment mark of a semiconductor device, and more particularly to a pattern alignment mark of a semiconductor device being able to measure the overlay accuracy of patterns.

A pattern alignment mark for measuring overlay accuracy of patterns, in general, takes the form of double boxes, i.e. an interior and an exterior box. Conventional results of use of the pattern alignment mark will be explained in the following.

Figure 1A:
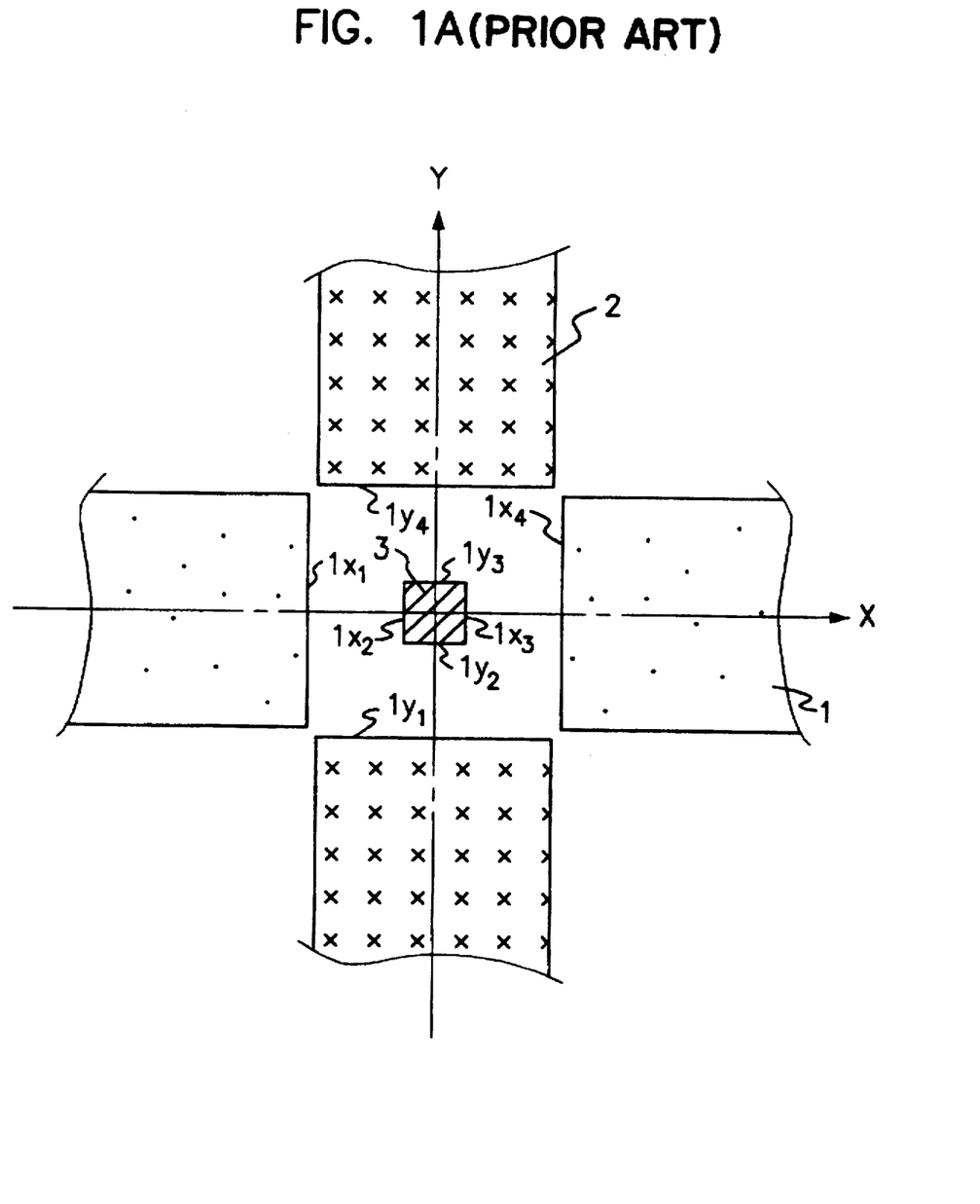
FIG. 1(A) is a plane figure of a pattern alignment mark according to the conventional techniques.
Figure 1B:
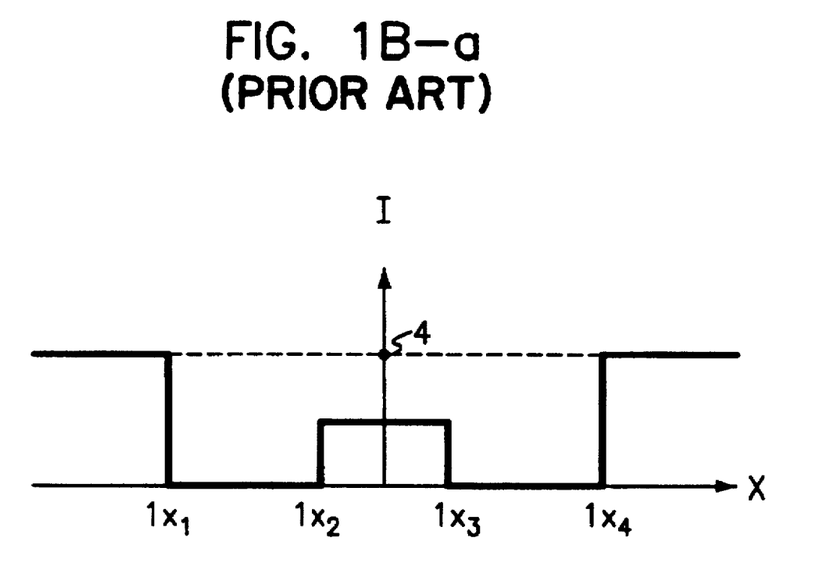

FIG. 1A shows a plan figure of a pattern alignment mark according to the conventional techniques. FIGS. 1B-a and 1B-b show the reflection intensities of light toward the X axis and the Y axis of a pattern alignment mark formed according to the conventional techniques. As shown in FIGS. 1B-a and 1B-b, according to the conventional techniques, at polysilicon film patterns 1, 2, 3, formed on a wafer for measuring the overlay accuracy, the light reflection intensity 4 reflected from a polysilicon pattern 1 at the X axis and the light reflection intensity 5 reflected from a polysilicon pattern 2 at the Y axis have different intensities. Therefore, when measuring the consecutive overlay accuracy which finds the distance between boundary sides $1_{x2}$, $1_{x3}$, $1_{y2}$, $1_{y3}$ of the polysilicon film pattern 3 for forming the interior box and boundary sides $1_{x1}$, $1_{x4}$, $1_{y1}$, $1_{y4}$ of the polysilicon film patterns 1, 2 for forming the exterior box, an alignment error could occur.

SUMMARY OF THE INVENTION

Therefore, it is an object of the present invention to eliminate the aforementioned problems by providing a method for forming a pattern alignment mark of a semiconductor device which prevents the occurrence of alignment error by diminishing regional differences in the light reflection intensities while measuring the overlay accuracy of patterns.

In order to attain the foregoing objects, the present invention comprises, in a pattern alignment mark equipped with at least one designated measuring pattern for an alignment during the process of fabrication of semiconductor devices, a means for attenuating light reflection on the pattern with higher light reflection intensity among the designated measuring patterns.

BRIEF DESCRIPTION OF THE DRAWINGS

The above and other objects, features and advantages of the present invention will be clearly understood from the following detailed description taken in conjunction with the accompanying diagrams, in which:

FIGS. 1B-a and 1B-b are graphs showing the light reflection intensities toward the X axis and the Y axis of a pattern alignment mark formed according to the conventional techniques;

FIGS. 2B-a and 2B-b are graphs showing the light reflection intensities toward the X axis and the Y axis of a pattern alignment mark formed according to one embodiment of the present invention;

DETAILED DESCRIPTION OF THE PREFERRED EMBODIMENTS

Referring to FIGS. 2A, 2B, 3, 4, 5 and 6, the embodiments of the present invention are described in detail in the following.

Figure 2A:
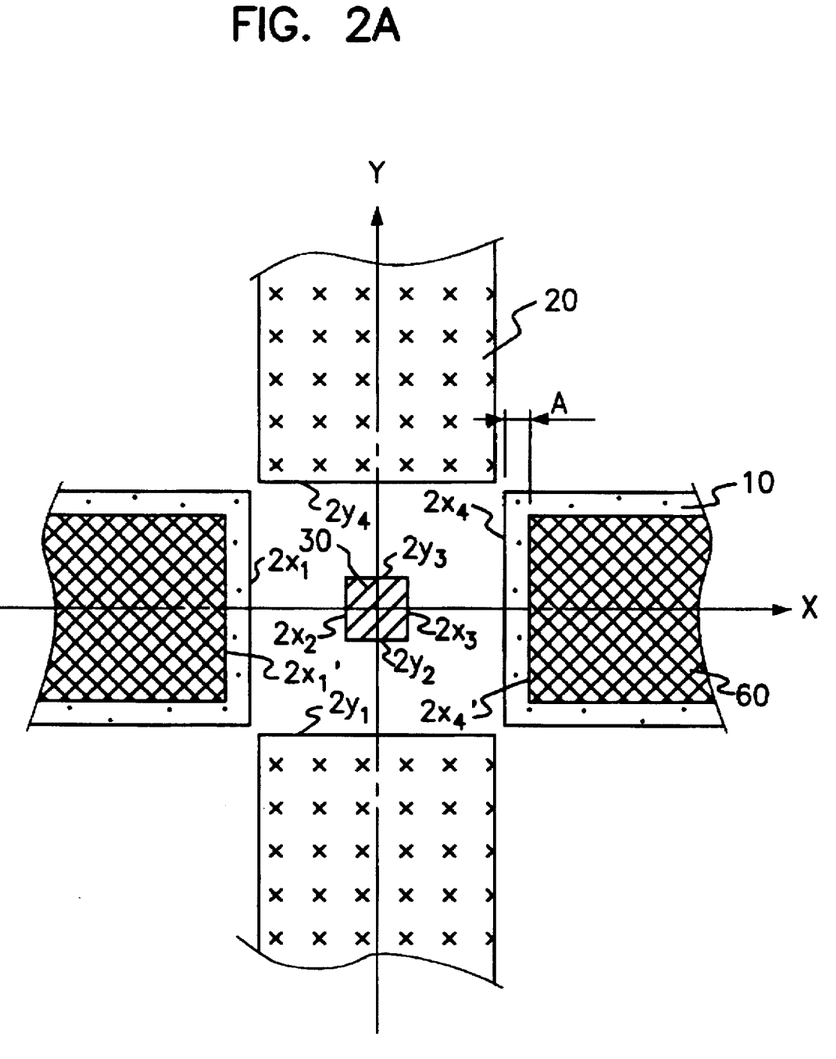
FIG. 2A is a plane figure of a pattern alignment mark according to one embodiment of the present invention.
Figure 2B:
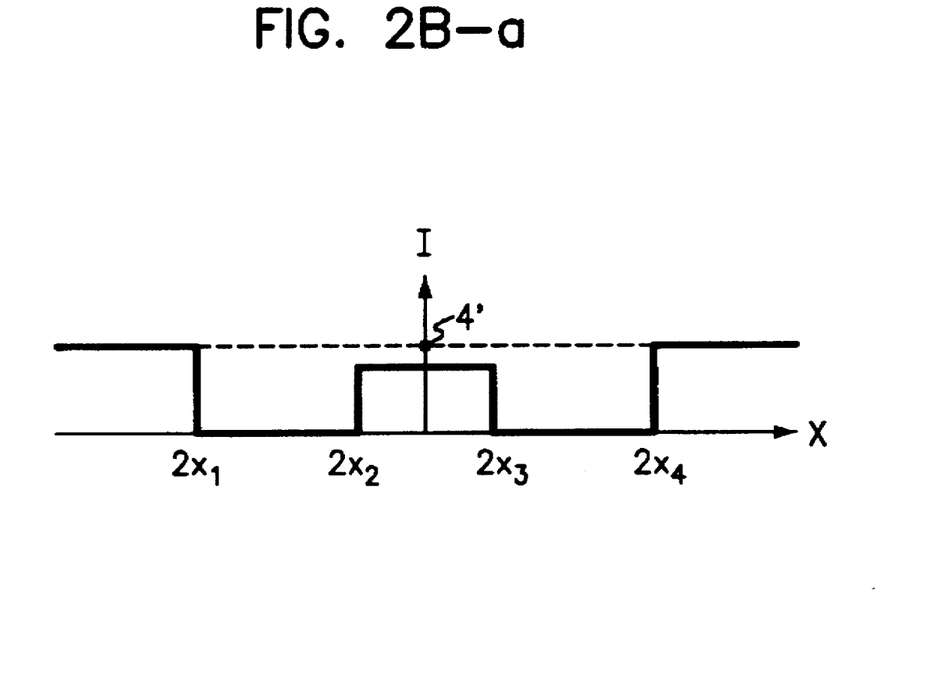

FIG. 2A shows a plane figure forming a pattern alignment mark according to one embodiment of the present invention. FIGS. 2B-a and 2B-b show the light reflection intensity toward the X axis and the Y axis of a pattern alignment mark formed according to one embodiment of the present invention. The embodiment according to the present invention shows the diminution of light reflection intensity toward the X axis by additionally forming a photoresist film pattern 60 on the first polysilicon film pattern 10 which has higher light reflection intensity than the first and the second polysilicon film patterns 10 and 20 which are formed to make the exterior box of a pattern alignment mark.

Therefore, as shown in FIGS. 2B-a and 2B-b, the light reflection intensities, 4', 5' of said polysilicon film patterns 10 and 20 could be equalized. Accordingly, overall regional differences in the light reflection intensities could be eliminated.

It is recommended that said photoresist film pattern 60 is simultaneously formed with the formation of the third polysilicon film pattern 30 for making an interior box of a pattern alignment mark.

In the case where two boundary sides $2_{x1}$, $2_{x4}$, of the first polysilicon film patterns 10 and two boundary sides $2_{x1'}$, $2_{x4'}$ of the photoresist film patterns 60 are matching, it may be difficult to measure the overlay accuracy of patterns. Thus, as shown in FIG. 2A, the boundary sides $2_{x1'}$, $2_{x4'}$ of the photoresist film patterns 60 are located outwardly from the boundary sides $2_{x1}$, $2_{x4}$ of the first polysilicon film patterns 10 by a margin (A) of at least 2 μm.

Figure 3:
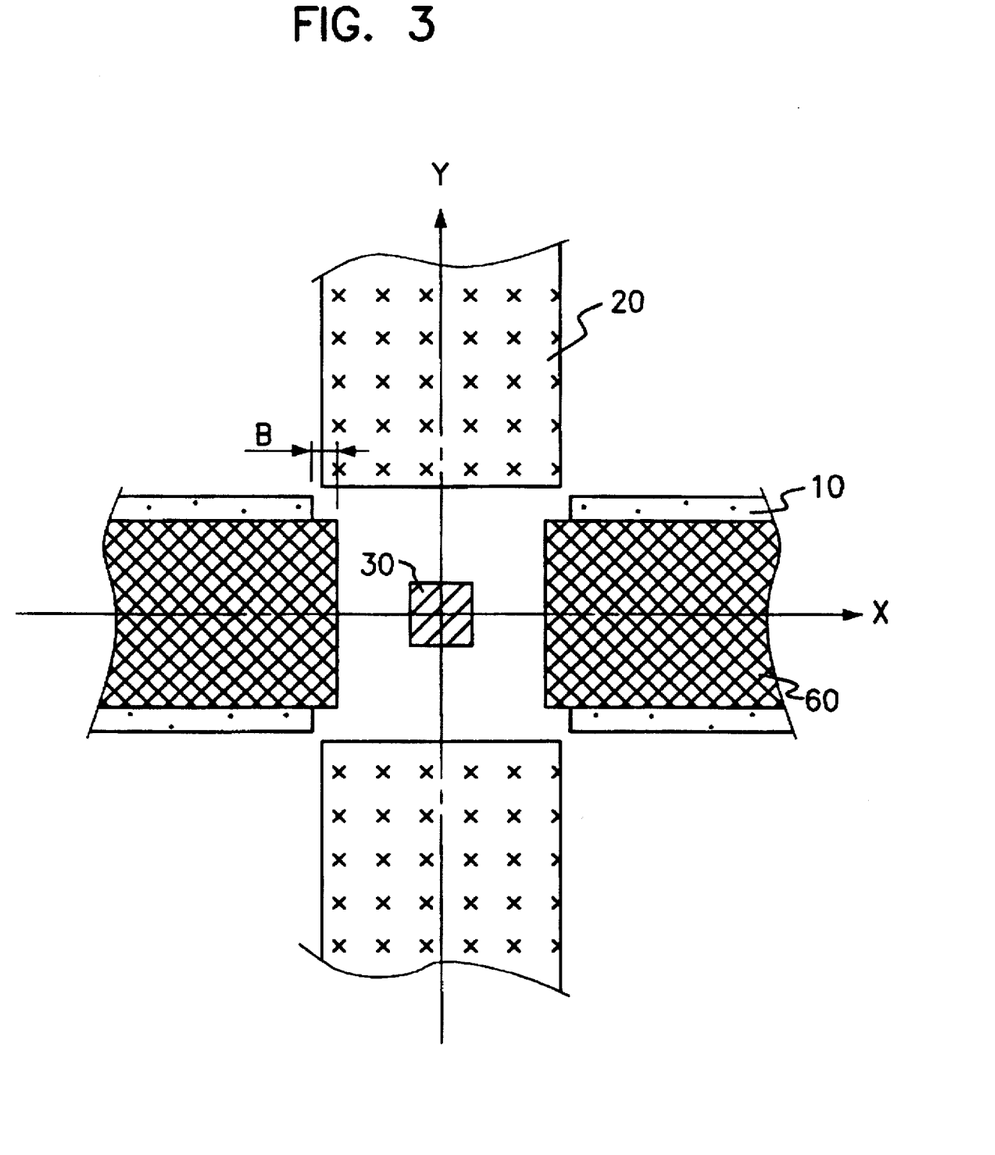
FIGS. 3, 4, 5 and 6 are plane figures of a pattern alignment mark according to other embodiments of the present invention.
Figure 4:
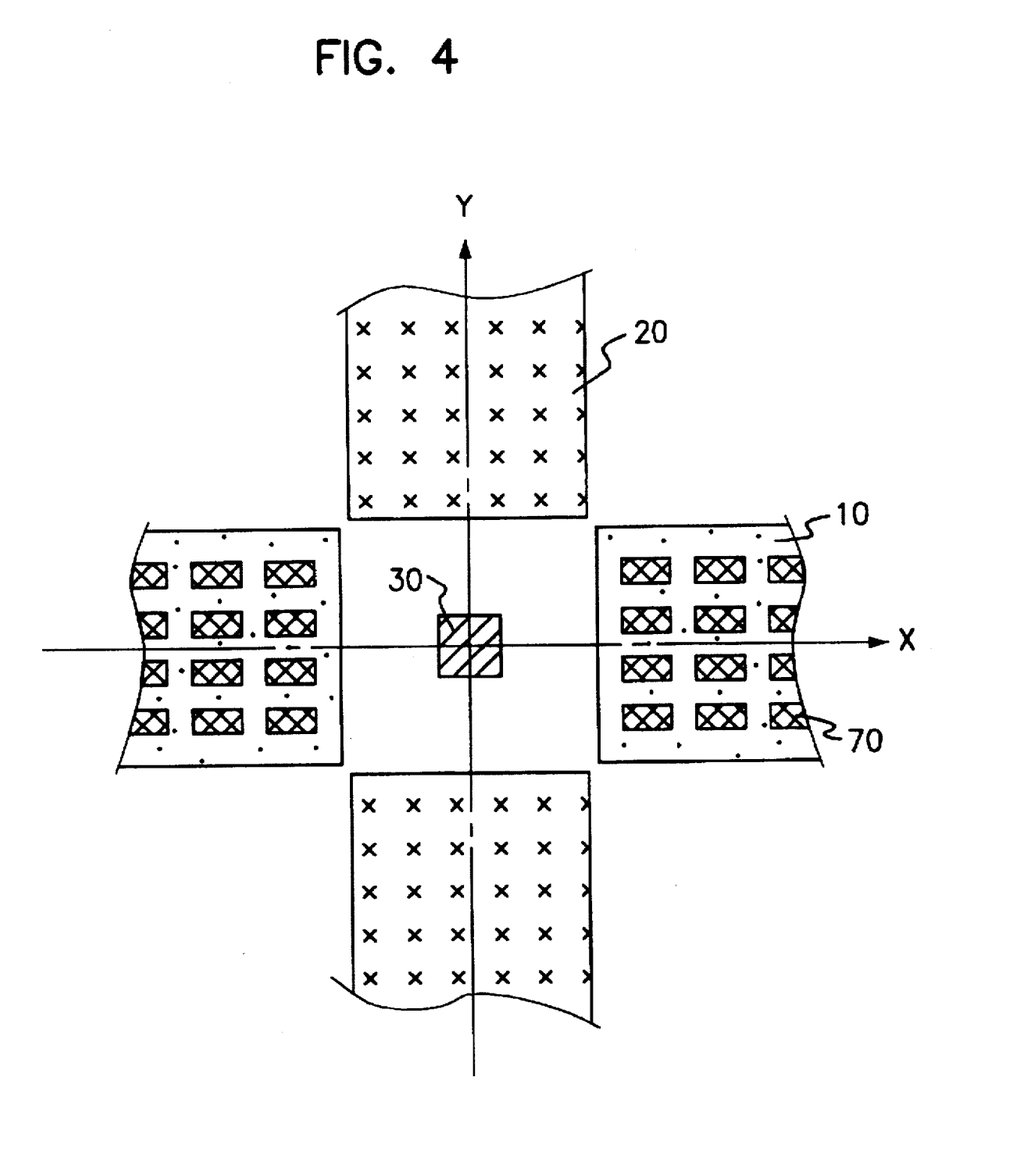

FIGS. 3, 4, 5 and 6 show plane figures of a pattern alignment mark according to other embodiments of the present invention. According to the embodiment of the present invention, as shown in FIG. 3, photoresist film patterns 60 are formed inwardly to overspread the boundary sides $2_{x1}$, $2_{x4}$ Of the first polysilicon film patterns 10 by a margin of 2 μm to 5 μm (b), and as shown in FIG. 4, photoresist film patterns 70 could be formed with multiple rectangular patterns arrayed so that each side thereof has a size of 1 μm to 4 μm.

Figure 5:
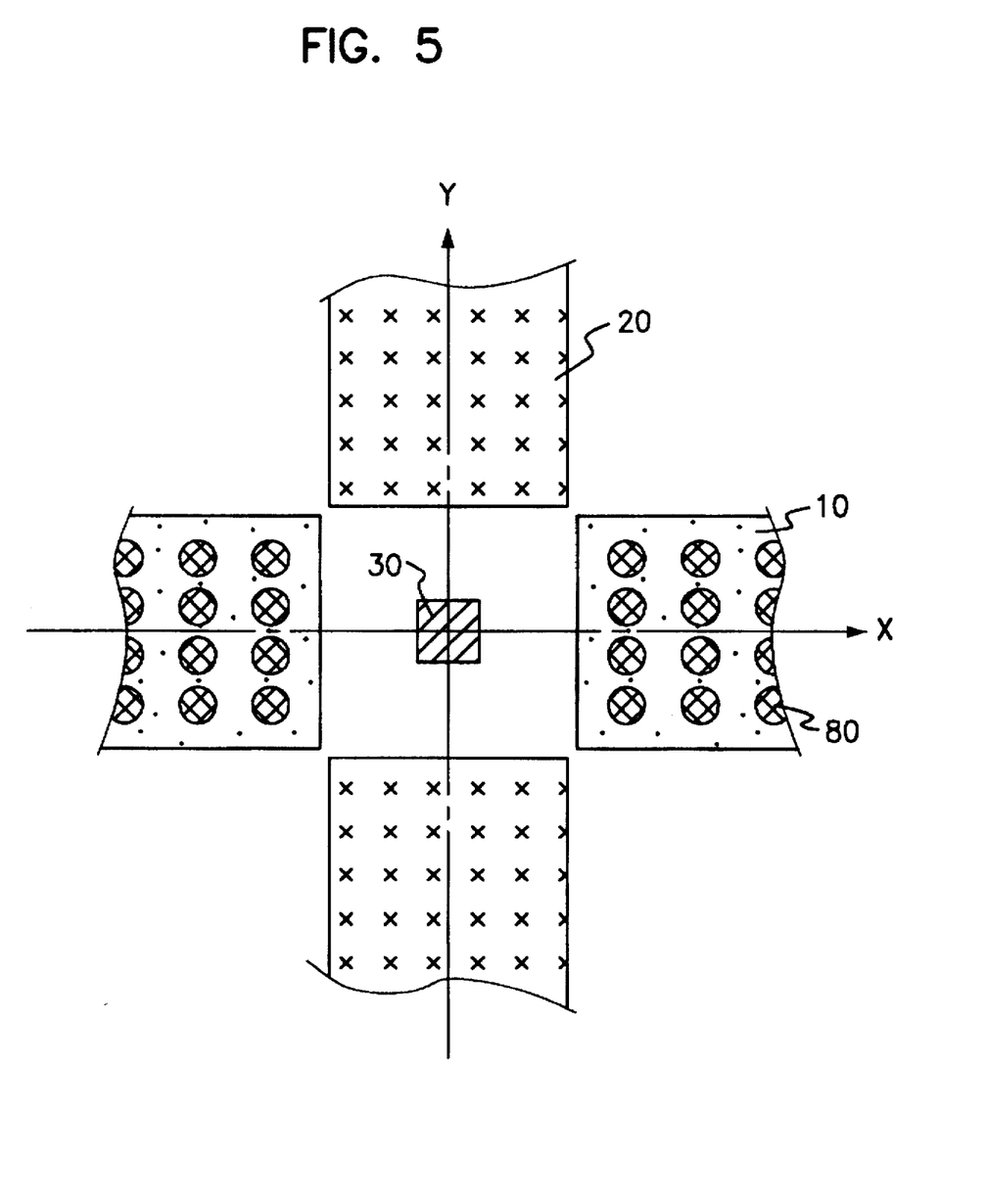
Figure 6:
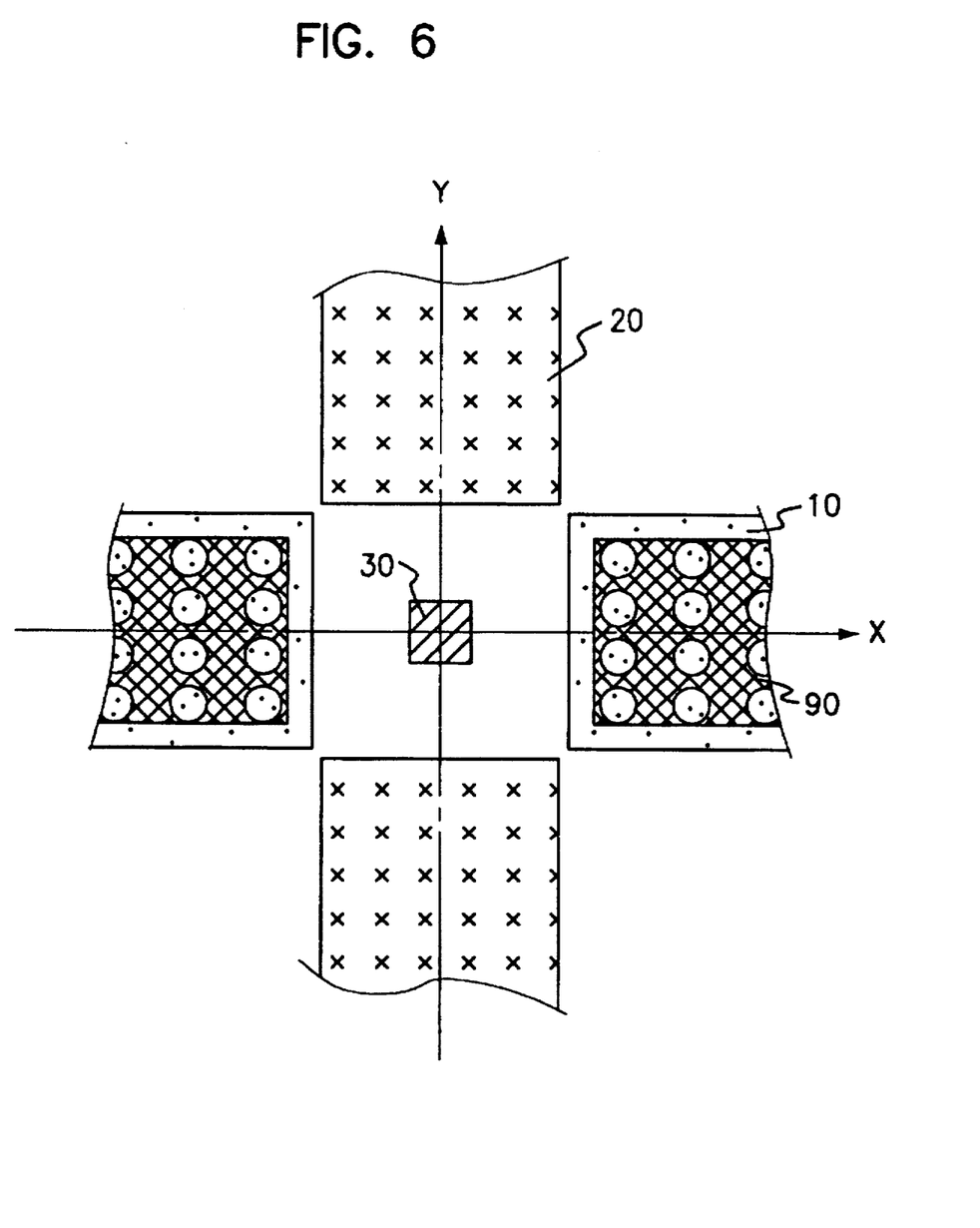

According to the embodiment of the present invention, as shown in FIG. 5, photoresist film patterns 80 could be formed with multiple circular patterns arrayed so that the diameter thereof has a size of 1 μm to 4 μm, and as shown in FIG. 6, photoresist film patterns 90 could be formed with multiple holes arrayed so that the diameter thereof has a size of 1 μm to 4 μm. It is proper that the photoresist film patterns 60, 70, 80 and 90 could be either positive or negative type.

Overlay accuracy measurement for an alignment is done by measuring the distance between the boundary sides $2_{x2}$, $2_{x3}$, $2_{y2}$, $2_{y3}$ of the third polysilicon film pattern 30, which forms the interior box, and the boundary sides $2_{x1}$, $2_{x4}$, $2_{y1}$, $2_{y4}$ of the first and second polysilicon film patterns 10, 20, which form the exterior box.

As above mentioned, the present invention prevents the occurrence of a pattern alignment error due to the differences in the light reflection intensities while measuring the overlay accuracy of patterns, and thus could have the special effect of enhancing the yield and the reliability of fabrication by achieving the stabilization of the process and the reduction of the process time.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A pattern alignment mark formed on a substrate to form a semiconductor device, comprising:
   - a plurality of designated measuring patterns for measuring overlay accuracy of layers, at least one of said designated measuring patterns having greater reflected light intensity along an x-axis direction relative to a y-axis direction;
   - a light reflection attenuating means formed on said at least one of said designated measuring patterns for decreasing light reflected along the x-axis direction relative to the y-axis direction; and
   - thereby reducing any difference in intensity along the x and y axes directions and improving accuracy in measuring distance between adjacent patterns.

2. A pattern alignment mark according to claim 1, wherein at least one measuring pattern among said designated measuring patterns includes an interior and an exterior box.

3. A pattern alignment mark according to claim 1, wherein said attenuating means includes first boundary sides, said at least one of said designated measuring patterns having greater reflected light intensity and including second boundary sides, said first boundary sides being located outwardly from said second boundary sides so as to expose said second boundary sides of said at least one of said patterns with greater reflected light intensity by a margin of at least 2 μm.

4. A pattern alignment mark according to claim 1, wherein said attenuating means includes first boundary sides, said at least one of said designated measuring patterns having a greater reflected light intensity and including second boundary sides, said first boundary sides being formed inwardly from said second boundary sides so as to lay over said second boundary sides of said at least one of said patterns with greater reflected light intensity by a predetermined amount.

5. A pattern alignment mark according to claim 4, wherein said first boundary sides extend forwardly to overspread said second boundary sides by a margin of 2 μm to 5 μm.

6. A pattern alignment mark according to claim 1, wherein said attenuating means includes an array of multiple rectangular patterns.

7. A pattern alignment mark according to claim 6, wherein said multiple rectangular patterns are arrayed so that each side thereof has a size of 1 μm to 4 μm.

8. A pattern alignment mark according to claim 1, wherein said attenuating means includes an array of multiple circular patterns.

9. A pattern alignment mark according to claim 8, wherein said multiple circular patterns are arrayed so that the diameter thereof has a size of 1 μm to 4 μm.

10. A pattern alignment mark according to claim 1, wherein said attenuating means includes an array of multiple holes.

11. A pattern alignment mark according to claim 10, wherein said multiple holes are arrayed so that the diameter thereof has a size of 1 μm to 4 μm.

12. A pattern alignment mark according to claim 1, wherein said attenuating means includes a photoresist film.

* * * * *